United States Patent [19]

Maringer

[11] 4,234,846

[45] Nov. 18, 1980

[54] METHODS OF ELIMINATING CONVERSION FACTOR DRIFT EFFECTS IN A CLIP-ON HALL-EFFECT AMMETER

[75] Inventor: Albert Maringer, Karlsruhe, Fed. Rep. of Germany

[73] Assignee: Siemens Aktiengesellschaft, Munich, Fed. Rep. of Germany

[21] Appl. No.: 928,688

[22] Filed: Jul. 27, 1978

[30] Foreign Application Priority Data

Aug. 3, 1977 [DE] Fed. Rep. of Germany ....... 2735054

[51] Int. Cl.³ .............................................. G01R 33/00
[52] U.S. Cl. .............................. 324/117 H; 324/127; 324/251
[58] Field of Search ............... 324/127, 117 H, 117 R, 324/251; 323/94 H; 338/32H; 307/309

[56] References Cited

U.S. PATENT DOCUMENTS 3,050,698  8/1962   Brass ..................................... 307/309
4,059,798  11/1977  Dierker et al. .................. 324/117 H Primary Examiner—Ernest F. Karlsen
Attorney, Agent, or Firm—Kenyon & Kenyon

[57] ABSTRACT

A clip-on ammeter includes a magnetic frame, which is designed as a clamp and accommodates a winding and a Hall element in an air gap, a reference current source and a commutating switch for connecting the current source to the winding. Methods of operating include taking measurements with reference current flowing in each of the two possible directions in the winding and secondly with reference current flowing to oppose the effect of the current under measurement and with no reference current flowing. The conversion factor is calculated for use in obtaining readings free of conversion factor drift.

4 Claims, 1 Drawing Figure

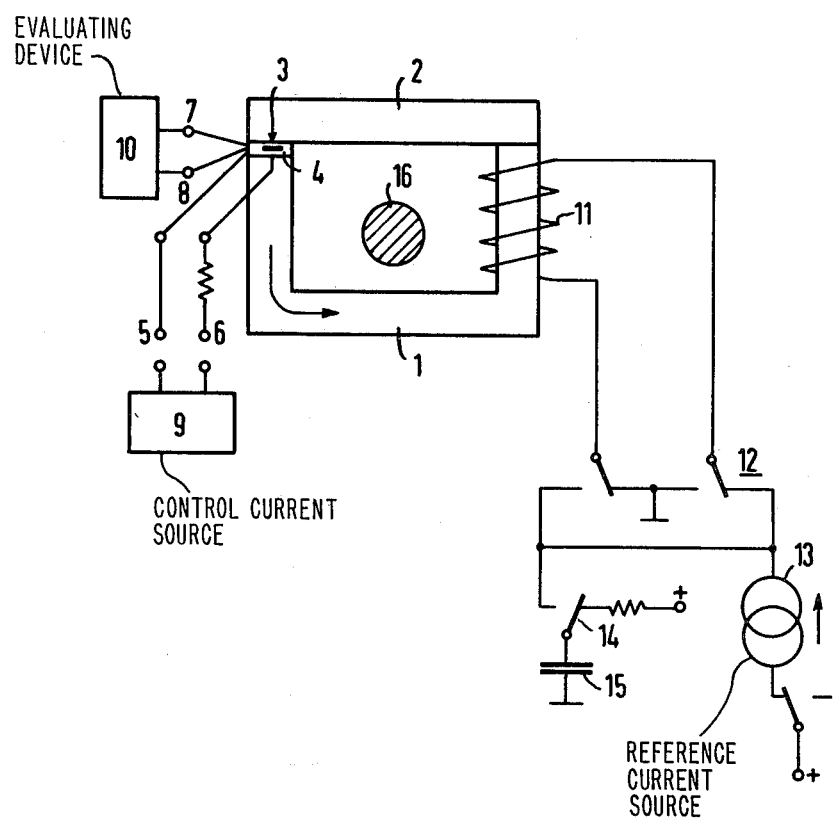

METHODS OF ELIMINATING CONVERSION FACTOR DRIFT EFFECTS IN A CLIP-ON HALL-EFFECT AMMETER

BACKGROUND OF THE INVENTION

This invention relates to a clip-on ammeter in general and more particularly to a clip-on ammeter which permits obtaining improved measurement accuracy.

In conventional current measurements, it is necessary to sever the current carrying line and to insert into the line a measuring element, be it an ammeter or a measuring resistor, at which the voltage can be measured. Interrupting the line carrying the current to be measured can be avoided if a so-called clip-on ammeter is placed around the line. For a-c current, clip-on transformers have been in use for a long time. After technically usable Hall elements were introduced, clip-on ammeters also became possible for d-c current measurements.

As is well known, what is known as a Hall generator consists of a rectangular semiconductor chip, at the narrow sides of which contacts for feeding in a control current are attached. If this element is brought into the air gap of a magnetic frame or, more generally, into a magnetic field, then what is known as a Hall voltage can be taken off at appropriate contacts on its long sides.

The Hall voltage is proportional to the current through the Hall element and proportional to the magnetic flux going through the Hall element perpendicularly.

The conversion factor which appears in this relation between the Hall voltage, the magnetic flux and the control current, however, is not constant. It is subject to fluctuations which are due to the properties of the semiconductor material of the Hall element and also to the properties of the magnetic frame.

SUMMARY OF THE INVENTION

It is an object of the present invention to provide measures to achieve independence of the fluctuating conversion factor as far as possible in different measurements.

According to the present invention, this problem is solved by providing a commutating switch which permits a reference DC current source to be connected to the winding.

If two measurements for determining the current flowing in a conductor enclosed by the magnetic frame, with different direction or magnitude of the reference current in the winding arranged on the magnetic frame are now made, then the conversion factor can be eliminated after the difference of the measured Hall voltages is formed.

Two advantageous operating modes for the new clip-on ammeter are available. In one, a measurement is made with the reference current source connected in the direction of weakening of the magnetic induction caused by the current to be measured, after a measurement of the Hall voltage with the reference current source disconnected, and the conversion factor is calculated from both measurement results after the difference is formed.

In the second method, two measurements of the Hall voltages are performed with the reference current source connected differently as to the direction of the current, and the conversion factor is calculated from these results after the difference is formed.

For the first-named operating method, the following relations are obtained for the calculation, where $U_{H1}$ is the Hall voltage obtained from a first measurement, $U_{H2}$ is the Hall voltage of a second measurement, K is the conversion factor, $I_M$ is the current to be measured, $I_{ref}$ is the reference current, and w is the number of turns of the winding.

The measurement results obey the equations:

$$U_{H1} = K \cdot I_M$$

$$U_{H2} = K \cdot I_M - I_{ref} K \cdot w$$

This becomes, by forming the difference:

$$U_{H1} - U_{H2} = I_{ref} K \cdot w$$

$$K = (U_{H1} - U_{H2})/I_{ref} w.$$

Substituting the equation for K in the first measurement result, one obtains for the current to be measured:

$$I_M = U_{H1} \cdot I_{ref} w/(U_{H1} - U_{H2}).$$

The second operating method, with two measurements, furnishes results which obey the relations below:

$$U_{H1} = K \cdot I_M + I_{ref} K \cdot w$$

$$U_{H2} = K \cdot I_M - I_{ref} K \cdot w$$

By forming the difference, this becomes:

$$U_{H1} - U_{H2} = 2 I_{ref} K \cdot w.$$

From this follows:

$$K = (U_{H1} - U_{H2})/2 I_{ref} w$$

and, after substituting this value, for the measuring current:

$$I_M = U_{H1} \cdot 2 I_{ref} \cdot w/(U_{H1} - U_{H2}) - I_{ref} \cdot w$$
$$= I_{ref} w [2 U_{H1}/(U_{H1} - U_{H2}) - 1]$$

The methods are attractive particularly for equipment in which the evaluating device of the Hall voltage includes a minicomputer or a microprocessor. This evaluating device can also control the two measurements which are required for determining a current value, can store their results and process them further.

With the new clip-on ammeter, one obtains the additional advantage of easy null correction. For this purpose, two measurements of the Hall voltage are made with the reference current source connected with different current directions, and with the clamp empty, i.e., when no current carrying conductor is enclosed by the clamp. Adding the two measurement results furnishes directly twice the value of the offset voltage which can then be used for correcting the zero point.

The use of the new clip-on ammeter is found to be particularly advantageous in the diagnosis of vehicles with electrical equipment.

BRIEF DESCRIPTION OF THE DRAWING

The single FIGURE is a block-schematic diagram of the clip-on ammeter of the present invention.

DETAILED DESCRIPTION OF THE INVENTION

A magnetic frame which consists of a U-shaped frame 1 and an I-shaped part 2, has an air gap 3 into which a Hall element is inserted. During measurement the magnetic frame encloses a current carrying conductor 16. The Hall element has four connections 5 to 8. A control current source 9 can be connected to the terminals 5 and 6; to the terminals 7 and 8, at which the Hall voltage can be taken off, an evaluating device 10 is connected. A winding 11 is placed on one leg of the U-shaped part 1 of the magnetic frame. The ends of the winding are connected to contacts of a current reversing switch 12. The reversing switch 12 selectively connects the current source 13 across winding 11 to provide a reference current in a first direction or a second direction in the winding 11. The reversing switch 12 is positioned in a first position to provide the first measurement and in a second position to provide a second measurement in the above described method. The terminals identified with a plus sign are connected to a power source or power sources wherein one side of the power source or power sources connects to ground. When the reversing switch 12 is in the position, of the two possible operable positions, not shown in the drawing it is possible to adjust the hysteresis curve, that is, deguass the magnetic frame 1, 2 by discharging capacitor 15 through winding 11 to a reference potential. Capacitor 15 is connected by a first lead to a reference potential and by a second lead to a switch 14. The switch 14 is a single-pole double-throw switch which may be selectively coupled, by way of a resistor, to a power source identified by a plus sign or to one of the poles of switch 12 as explained above. When the switch 14 is connected to the power source via the resistor, capacitor 15 is charged. When switch 14 is connected to one of the poles of switch 12 capacitor 15 is discharged through winding 11. Together with winding 11, capacitor 15 forms an oscillating circuit in which a decaying oscillating signal is produced which serves to degauss magnetic frame 1, 2.

I claim:

1. A method of operating a clip-on ammeter which includes a magnetic frame in the form of a clamp for enclosing a conductor in which current is to be measured, an air gap in the frame in which a Hall element is disposed for developing a Hall voltage and a winding of w turns on said frame, comprising:
   (a) enclosing a conductor with said frame;
   (b) measuring the Hall voltage $U_{H1}$ of the Hall element;
   (c) coupling a reference current source establishing a current $I_{ref}$ in said winding to said winding in a direction such as to weaken the magnetic induction caused by the current in said conductor;
   (d) measuring the Hall voltage $U_{H2}$ with said reference current source coupled across said winding;
   (e) forming the difference of the two measurements; and
   (f) calculating a conversion factor K from said difference, said Hall voltage measurements said number of windings and said current $I_{ref}$ using the equation $K=(U_{H1}-U_{H2})/(I_{ref}w)$.

2. The method of claim 1 wherein said steps of forming and calculating are performed with a computer.

3. A method of operating a clip-on ammeter which includes a magnetic frame in the form of a clamp for enclosing a conductor in which current is to be measured, an air gap in the frame in which a Hall element is disposed for developing a Hall voltage and a winding of w turns on said frame, comprising:
   (a) enclosing a conductor with said frame;
   (b) coupling a reference current source to said winding so as to result in a current $I_{ref}$ in one direction;
   (c) measuring the Hall voltage $U_{H1}$ of said Hall element;
   (d) coupling said reference current source to said winding so as to result in a current $I_{ref}$ in the other direction;
   (e) measuring the Hall voltage $U_{H2}$ of said Hall element;
   (f) forming the difference of said two measurements; and
   (g) calculating a conversion factor K from said difference, said measurements, said number of windings and said current $I_{ref}$ with the equation $K=(U_{H1}-U_{H2})/(2I_{ref}w)$.

4. The method of claim 3 wherein said steps of forming and calculating are performed with a computer.